United States Patent
Schaefer

(10) Patent No.: US 10,852,323 B2
(45) Date of Patent: Dec. 1, 2020

(54) MEASUREMENT APPARATUS AND METHOD FOR ANALYZING A WAVEFORM OF A SIGNAL

(71) Applicant: Rohde & Schwarz GmbH & Co. KG, Munich (DE)

(72) Inventor: Andrew Schaefer, Oberhaching (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 0 days.

(21) Appl. No.: 16/713,279

(22) Filed: Dec. 13, 2019

(65) Prior Publication Data
US 2020/0209281 A1 Jul. 2, 2020

Related U.S. Application Data

(60) Provisional application No. 62/785,931, filed on Dec. 28, 2018.

(51) Int. Cl.
- *G06K 9/00* (2006.01)
- *G01R 13/02* (2006.01)
- *G06K 9/46* (2006.01)
- *G06T 11/20* (2006.01)

(52) U.S. Cl.
CPC ....... *G01R 13/0245* (2013.01); *G06K 9/4642* (2013.01); *G06T 11/206* (2013.01); *G06T 2210/36* (2013.01)

(58) Field of Classification Search
None
See application file for complete search history.

(56) References Cited

U.S. PATENT DOCUMENTS

| | | | | |
|---|---|---|---|---|
| 4,263,593 A | * | 4/1981 | Dagostino | G01R 13/345 315/367 |
| 4,359,728 A | * | 11/1982 | Mahony | G09G 1/162 345/440.1 |
| 4,370,646 A | * | 1/1983 | Mahony | G09G 1/162 345/20 |
| 4,510,571 A | * | 4/1985 | Dagostino | G01R 13/345 315/383 |
| 4,516,119 A | * | 5/1985 | Fukuta | G01R 13/20 345/440.1 |
| 4,560,981 A | * | 12/1985 | Jackson | G06F 11/322 345/440.1 |
| 4,829,293 A | * | 5/1989 | Schlater | G01R 13/225 324/121 R |
| 5,065,147 A | * | 11/1991 | Rice | G01R 13/0227 345/440.1 |
| 5,245,324 A | * | 9/1993 | Jonker | F02P 17/08 324/121 R |
| 5,247,287 A | * | 9/1993 | Jonker | F02P 17/08 324/121 R |

(Continued)

*Primary Examiner* — Martin Mushambo
(74) *Attorney, Agent, or Firm* — Westman, Champlin & Koehler, P.A.

(57) ABSTRACT

The present invention relates to an analysis of a waveform of a signal. A waveform of the signal is divided into multiple sections and a signal integrity identifier is assigned to each section. Accordingly, a representation of the respective signal integrity identifier may be provided for each section of the waveform. The representation of the signal integrity identifier may comprise an abstract representation, for example a graphical element, an alphanumeric element, a color or even an audio signal.

16 Claims, 3 Drawing Sheets

(56) References Cited

U.S. PATENT DOCUMENTS

| | | | | |
|---|---|---|---|---|
| 5,250,935 A * | 10/1993 | Jonker | ............... | F02P 17/08 |
| | | | | 324/379 |
| 5,434,954 A * | 7/1995 | Kawauchi | ............ | G01R 13/345 |
| | | | | 345/440 |
| 5,793,642 A * | 8/1998 | Frisch | ............... | G01R 31/316 |
| | | | | 703/4 |
| 6,570,592 B1 * | 5/2003 | Sajdak | ............... | G01R 13/02 |
| | | | | 345/440.1 |
| 6,571,185 B1 * | 5/2003 | Gauland | ............ | G01R 13/02 |
| | | | | 702/68 |
| 7,227,549 B2 * | 6/2007 | Beasley | ............ | G01R 13/0236 |
| | | | | 345/440.1 |
| 7,403,560 B2 * | 7/2008 | Gamper | ............ | G01R 13/0245 |
| | | | | 375/228 |
| 8,325,867 B2 * | 12/2012 | Obata | ............... | G01R 31/31709 |
| | | | | 375/371 |
| 8,479,081 B2 * | 7/2013 | Sugaya | ............ | H04L 1/245 |
| | | | | 714/776 |
| 10,014,978 B2 | 7/2018 | Horn et al. | | |
| 2002/0075267 A1 * | 6/2002 | Cake | ............... | G06F 9/44505 |
| | | | | 345/440 |
| 2002/0180737 A1 * | 12/2002 | Letts | ............... | G01R 13/0263 |
| | | | | 345/440.1 |
| 2003/0006990 A1 * | 1/2003 | Salant | ............... | G01R 13/345 |
| | | | | 345/440.1 |
| 2003/0107573 A1 * | 6/2003 | Miller | ............... | G01R 13/02 |
| | | | | 345/440 |
| 2003/0163266 A1 * | 8/2003 | Ward | ............... | G01R 13/0245 |
| | | | | 702/67 |
| 2004/0017366 A1 * | 1/2004 | Narita | ............... | G01R 13/0227 |
| | | | | 345/208 |
| 2006/0055698 A1 * | 3/2006 | Ritter | ............... | G01R 13/02 |
| | | | | 345/440.1 |
| 2008/0071488 A1 * | 3/2008 | Cake | ............... | G01R 13/0263 |
| | | | | 702/67 |
| 2008/0231636 A1 * | 9/2008 | Yang | ............... | G05B 23/0229 |
| | | | | 345/440.1 |
| 2009/0002372 A1 * | 1/2009 | Yao | ............... | A61B 5/00 |
| | | | | 345/440.1 |
| 2009/0109226 A1 * | 4/2009 | Nelson | ............ | G01R 13/0236 |
| | | | | 345/440.1 |
| 2009/0149723 A1 * | 6/2009 | Krauss | ............ | A61B 5/7425 |
| | | | | 600/301 |
| 2009/0245339 A1 * | 10/2009 | Obata | ............... | G06T 11/206 |
| | | | | 375/226 |
| 2009/0267947 A1 * | 10/2009 | Libby | ............... | G01R 13/02 |
| | | | | 345/440.1 |
| 2009/0290793 A1 * | 11/2009 | Engholm | ............ | G01R 13/029 |
| | | | | 382/171 |
| 2009/0309879 A1 * | 12/2009 | Gorbics | ............ | G01R 13/0236 |
| | | | | 345/440.1 |
| 2013/0125006 A1 * | 5/2013 | Rule | ............... | H04L 43/18 |
| | | | | 715/738 |
| 2015/0206026 A1 * | 7/2015 | Kim | ............... | G06K 9/00335 |
| | | | | 382/170 |
| 2015/0301086 A1 * | 10/2015 | Schaefer | ............ | G01R 13/0263 |
| | | | | 324/76.13 |
| 2015/0366518 A1 * | 12/2015 | Sampson | ............ | A61B 5/0478 |
| | | | | 600/301 |
| 2016/0005058 A1 * | 1/2016 | Sagara | ............... | G06Q 20/102 |
| | | | | 705/7.32 |
| 2016/0345907 A1 * | 12/2016 | Fung | ............... | A61B 5/6893 |
| 2017/0063492 A1 * | 3/2017 | Horn | ............... | H04L 7/044 |
| 2018/0074096 A1 * | 3/2018 | Absher | ............ | G01R 13/02 |
| 2018/0188916 A1 * | 7/2018 | Lyons | ............... | H04N 21/23418 |
| 2019/0029538 A1 * | 1/2019 | Jang | ............... | A61B 5/7235 |

\* cited by examiner

MEASUREMENT APPARATUS AND METHOD FOR ANALYZING A WAVEFORM OF A SIGNAL

CROSS-REFERENCE TO RELATED APPLICATION

This application claims the benefit of U.S. provisional application No. 62/785,931, filed on Dec. 28, 2018, the content of which is hereby incorporated by reference.

TECHNICAL FIELD

The present invention relates to a measurement apparatus for analyzing a waveform signal. The present invention further relates to a method for analyzing a waveform of a signal.

BACKGROUND

Although applicable in principle to any kind of measured waveform, the present invention and its underlying problem will be hereinafter described in combination with measuring a signal by an oscilloscope.

Oscilloscopes are very suitable measurement devices for displaying the temporal behavior of signals. When displaying an analogue or digital waveform of a signal, an oscilloscope may display a curve of signal level overtime. This may be very useful for a wide range of applications. However, due to increasing performance ability of measurement devices, for example increasing resolution and sampling rate, the amount of measurement data increases. Hence, it will become difficult to evaluate and interpret the measurement results, for example a waveform displayed by an oscilloscope. Furthermore, a full analysis of a measurement sequence may be very time-consuming. Against this background, a problem addressed by the present invention is to provide a simple analysis of a waveform of a signal. In particular, the present invention aims to provide an improved evaluation of a waveform of a signal.

SUMMARY

The present invention solves this problem by a measurement apparatus and a measurement method with the features of the independent claims. Further advantageous embodiments are subject-matter of the dependent claims.

According to a first aspect, a measurement apparatus for analyzing a waveform of a signal is provided. The apparatus comprises an acquisition device, a segmenting device, a processing device and an output device. The acquisition device is configured to acquire a waveform of a signal, in particular to acquire a waveform of a measured signal. The segmenting device is configured to identify a number of sections in the acquired waveform. In particular, each section may relate to a specific period of time. The processing device is configured to assign a signal integrity identifier to each section of the number of sections in the acquired waveform. The output device is configured to output a representation of the respective assigned signal integrity identifier for each section of the number of sections.

According to a further aspect, a method for analyzing a waveform of a signal is provided. The method comprises a step of acquiring a waveform of a signal, in particular of a measurement signal. The method further comprises a step of identifying a number of sections in the acquired waveform. Further, the method comprises a step of assigning a signal integrity identifier to each section of the number of sections in the acquired waveform. Finally, the method comprises a step of outputting a representation of the respective assigned signal integrity identifier for each section of the number of sections.

The present invention is based on the fact that an analysis of a waveform, i.e. a curve of a signal level over time by analyzing a simple graphical representation of the waveform by a user is a very difficult and time-consuming task. For example, a user has to go through the signal curve and evaluate the waveform for each point in time in order to identify deviations in a measured waveform with respect to a desired waveform. This may be a very exhausting task, and the user may easily overlook a failure in the signal curve.

Thus, it is an idea of the present invention to automatically evaluate the waveform of a measured signal and to provide additional information, which can assist a user when evaluating the waveform of a measured signal. In particular, the present invention aims to provide signal integrity identifiers for specifying the characteristic of the waveform of a measured signal. For this purpose, the waveform of the measured signal may be segmented into multiple successive segments, and a separate signal integrity identifier for each segment of the waveform. Accordingly, the user may check the provided signal integrity identifiers in order to evaluate the measured signal. In this way, the evaluation of the measured signal, in particular of the waveform of the measured signal can be simplified. Thus, the analysis of the waveform can be accelerated, and the probability of overlooking an abnormality in the waveform can be reduced.

The acquisition device may acquire the waveform for any kind of appropriate signal. For example, the signal may be a measurement signal, e.g. a measurement of a voltage over the time. The signal may be provided either as a digital data sequence or as an analogue signal. If the signal is provided as an analogue signal, the signal may be converted to a digital signal, for example by an analogue to digital converter.

The signal may come from any kind of signal source. For example, the signal may be provided by a measurement probe, a probe tip connected to a specific measuring point, an antenna etc. For example, the signal provided to the acquisition device may be a signal for transmitting data. In a possible example, the signal may be a modulated signal. For instance, data may be modulated on a carrier signal, for example a carrier having a predetermined frequency. Accordingly, the measurement signal may be a sinus signal. Furthermore, the measurement signal may be a signal of a pulse width modulation signal. However, any other kind of a measurement signal may be also possible.

The segmenting device may be configured to divide the acquired waveform in multiple sections. For example, the segmenting device may separate the acquired waveform in successive sections having a predetermined length, in particular a predetermined duration or a predetermined number of samples. For example, it may be possible that the length of each section is constant, i.e. the duration or the number of sample is the same for each section. Alternatively, it may be possible that the length of the individual sections may change over time. For example, the length may be dynamically adapted depending on any appropriate parameter.

The length of the individual sections may be determined according to any appropriate parameter. For example, a frequency of the signal may be determined and the corresponding periodic time may be used for dividing the waveform into individual sections. Alternatively, the individual sections of the acquired waveform may be identified based on any other appropriate parameter, for example a rising or falling edge, exceeding or falling below a predetermined threshold or any other appropriate criterion. For example, the signal may relate to a signal of a data stream having a specific clock rate. In this case, the segmentation may be performed based on the clock rate of the data stream.

The processing device may assign appropriate signal integrity identifiers to the individual sections identified by the segmenting device. The signal integrity identifier may provide an appropriate characterization of the waveform in the respective segment. For example, this characterization may specify whether or not the waveform in the respective section is in line with desired requirements. The signal integrity identifier may further provide a characterization of disturbances in the waveform of the respective section of the acquired waveform. The signal integrity identifier may provide the respective information regarding whether the waveform in the respective section is in line with desired requirements or whether disturbances or failures are identified in the respective section. In particular, the signal integrity identifiers may be provided in an abstract form. In other words, the signal integrity identifier provides an abstract indication, which is provided in addition or instead of a detailed representation of the waveform of the measured signal. In this way, the signal integrity identifier can be provided as a number of standardized indications. Accordingly, such standardized indications may be easily recognized by a user. Thus, the user can grasp the signal integrity identifier very easily.

The output device may provide the representation of the signal integrity identifier, which is assigned to a section of the acquired waveform in any appropriate manner. For example, the representation may be provided on a display as an optical indication. Additionally, or alternatively, it may be also possible to output the signal integrity identifier in any other appropriate manner, for example by an acoustical signal, e.g. a sound signal is output if the waveform of the signal does not correspond to a desired theoretical waveform. In another example, a lamp may be switched on or may flash if a deviation from the theoretical desired waveform is determined. However, any other appropriate schema may be used for indicating the signal integrity identifiers. Thus, the output device may comprise a display, a lamp, a loudspeaker or any other appropriate device for outputting the representation of the assigned signal integrity identifier.

The measurement apparatus, in particular the acquisition device, the segmenting device, the processing device and/or the output device may be realized by hardware elements. Furthermore, these elements may be also implemented at least in part by software. For this purpose, instructions may be stored in a memory that is coupled to a processor, for example a general purpose processor, via a memory bus. The processor may further execute an operating system that loads and executes instructions. The processor may be, for example an Intel processor that runs an operating system that loads and executes the instructions. Alternatively, the processor may be a processor of a measurement device that may run an embedded operating system that loads and executes the instructions.

Further embodiments of the present invention are subject of the further sub-claims and of the following descriptions referring to the drawings.

In a possible embodiment, the processing device assigns the signal integrity identifiers based on at least one characteristic property of the acquired waveform in the respective section.

For this purpose, the processing device may analyze the waveform of the signal. In particular, the processing device may analyze the waveform for each section separately. The processing device may verify whether or not the waveform in the respective section matches specific conditions. The specific condition may define, for example, an ideal desired waveform. Further, specific conditions may be defined for a number of one or more specific disturbances or failures. Accordingly, it is possible to determine whether the waveform in the respective section fulfills the requirements for a desired signal or whether a specific predetermined disturbance or failure can be identified in the waveform of the respective section.

In a possible embodiment, the at least one characteristic property may comprise at least one of the following properties: an error-free waveform, a runt, a glitch, duty cycle distortion, slew rate, crosstalk, intersymbol interference, reflection, noise or ripple. However, it is understood that any further kind of property, in particular any kind of distortion or failure may be also identified based on a characteristic property in a section of the waveform. In particular, for each specific property, it may be possible to specify predetermined characteristics, and the specified predetermined characteristics may be identified in the section of the waveform.

In a possible embodiment, the representation of the signal integrity identifier comprises at least one of a graphical representation, an alphanumeric element, in particular text, a color or an audio output.

The representation of the signal integrity identifier may be provided as an abstract element. For example, the abstract element may be a visualization or an acoustic signaling. However, any other kind of representation may be also used for providing the signal integrity identifier to a user. For example, it may be possible to provide a standardized schematic illustration of a waveform. The schematic graphical illustration of the waveform may illustrate a graphical symbol. In particular, the schematic graphical illustration may comprise individual symbols for an error-free waveform and further symbols for each kind of distortion or failure, which might be identified in a section of the acquired waveform. Such an abstract graphical representation allows a very fast and convenient recognition of a state of the waveform in the respective section.

Additionally, or alternatively, it may be also possible to provide an alphanumeric representation, for example a text or the like for indicating the signal integrity identifier of the respective section of the acquired waveform. For example, standardized text elements or acronyms may be used for indicating the respective signal integrity identifiers. Furthermore, it may be also possible to apply different colors depending on the respective signal integrity identifier. For example, a green color may be used for indicating an error-free waveform. Further colors may be used for indicating deviations or failures. For example, a red color may be used for indicating failures. However, it may be also possible to use a number of different colors for indicating different types of signal integrity identifiers. The different colors may be applied, for example to the schematic representation of the signal integrity identifier. However, it may be also possible to apply the different colors to a representation of the real waveform of the acquired signal. Furthermore, it may be also possible to apply the respective color to a background at a position of the respective section of the waveform. However, any other scheme for applying different colors may be also possible.

Furthermore, it may be also possible to provide an audio output depending on the identified signal integrity identifier.

For example, a frequency of an output signal may change depending on the respective signal integrity identifier. Furthermore, it may be possible to output only an audio signal if a failure or a distortion is detected in a section of the acquired waveform.

Any other kind of indicating the respective signal integrity identifiers may be also possible. For example, it may be possible to indicate the kind of signal integrity identifier by a lamp, in particular a LED. For example, the color of the lamp may change depending on the respective signal integrity identifier, or the lamp may be switched on or may flash depending on the respective signal integrity identifier.

In a possible embodiment, the output device is configured to display a representation of the waveform of the signal and to output a representation of the signal integrity identifier in association with the displayed representation of the waveform of the signal.

Accordingly, by providing the original waveform of the signal together with a representation of the signal integrity identifier, it is possible to easily analyze the waveform of the signal and detect abnormal sections, for example sections having a distortion of a failure. Furthermore, the user can easily recognize the kind of failure or distortion based on the provided representation of the signal integrity identifier. In this way, the positions and the type of distortion of failure can be easily identified. Thus, the time for analyzing the waveform of the signal can be minimized, and the probability for overlooking a failure or distortion in the acquired signal can be reduced.

In a possible embodiment, the output device is configured to automatically zoom the displayed representation of the waveform. In particular, the output device may zoom into a position relating to a predetermined signal integrity identifier. Accordingly, by automatically zooming the representation of the waveform of a signal, or at least providing the option for an automatically zooming, the examination of the waveform of the signal can be simplified and the time for analyzing the waveform of the signal can be reduced.

In a possible embodiment, the apparatus comprises a selection device. The selection device may be configured to automatically select a section of the respective signal integrity identifier which relates to a predetermined signal integrity identifier.

By providing an automatic selection of a section of the waveform, in particular a section, which relates to a specific signal integrity identifier, the further analysis of the signal waveform can be simplified and accelerated. In particular, further operations, for example a zoom operation or operations for automatically computing specific parameters of the waveform or any other kind of operations may be executed depending on the selection of a section of the waveform. Hence, by automatically providing an appropriate selection, the user can be assisted in the analysis of the waveform of the signal.

In a possible embodiment, the apparatus may comprise an analyzing device. The analyzing device may be configured to compute histogram data of the acquired waveform of the signal.

The histogram data may be computed separately for each section of the acquired waveform. The histogram data may relate to a histogram of the amplitude of the signal and/or a histogram of the sample width. The sample width may specify the number of samples between two measurement values having same or similar values. By acquiring histogram data of the signal, the amount of data may be decimated. Further, histogram data may provide an excellent and efficient basis for further analysis.

In a possible embodiment, the processing device is configured to compare the computed histogram data with a number of prestored reference data. Further, the processing device may be configured to assign the respective signal integrity identifier based on the result of the comparison.

By using histogram data as a basis for an analysis and by further using prestored reference data, for example reference data specifying a fingerprint of specific failures or distortions, a very fast and efficient identification of signal integrity identifiers can be achieved. In particular, a number of appropriate reference data may be stored in an appropriate memory, and the stored reference data may be used for a fast and efficient analysis of the waveform in the individual sections of the acquired waveform.

In a possible embodiment, the analyzing device is configured to divide the waveform of the signal into a number of slices. In particular, the division into the number of slices may be based on at least one threshold value. Further, the analyzing device may determine the histogram data based on the sliced waveform.

By applying appropriate thresholds or limits, a range of the acquired signal waveform may be divided into multiple slices or segments. Based on this segmentation, histogram data may be computed by counting the number of values in each slice. For this purpose, fixed predetermined threshold values may be used. However, it may be also possible to vary or dynamically adapt the threshold values in order to optimize the slicing and the computation of the histogram data. For example, it may be possible to apply equidistant threshold values. However, any other scheme for applying the slices may be also possible.

In a possible embodiment, the computed histogram data may comprise a pulse width histogram. In a pulse width histogram, the histogram data may count the pulse width of the individual pulses in a waveform of a signal. However, it may be also possible to analyze the amplitude (height) of the pulses.

In a possible embodiment, the processing device is configured to assign the signal integrity identifiers based on the determined histogram data. For example, the determined histogram data may be compared with prestored fingerprints. However, it may be also possible to apply any other scheme for identifying an appropriate signal integrity identifier based on histogram data.

In a possible embodiment, the analyzing device may comprise a neural network. The neural network may be configured to identify sections in the waveform. Additionally, or alternatively, the neural network may be configured to assign a signal integrity identifier to a section of the waveform.

By means of a neural network, a powerful analysis of the waveform of the acquired signal can be achieved. In particular, the efficiency and performance of the neural network can be improved depending on appropriate training data. To further improve the performance capability of the neural network, the analysis of the neural network may be applied to the histogram data. In this way, the amount of data to be analyzed by the neural network can be reduced and thus, the computational effort can be minimized.

In a possible embodiment, the apparatus comprises a histogram memory. The histogram memory may be configured to store the computed histogram data. By storing the computed histogram data, the histogram data may be available for further purposes. For example, the stored histogram data may be used for a later displaying of the waveform of the signal, for example on a display for a screen. Furthermore, the stored histogram data may be also used for any other kind of later analysis. By storing the histogram data instead of all samples of the measured signal, the amount of data can be significantly reduced. Furthermore, the histogram data represent preprocessed data, and thus, the further analysis, which can be based on the preprocessed histogram data may be executed more efficiently. Thus, the computational effort can be minimized, and the time for further operations based on the memorized histogram data can be reduced.

With the present invention it is therefore now possible to provide an automatically analysis of a waveform of a measurement signal, and to provide the result of this analysis in an improved and efficient manner. In particular, failures or distortions in the waveform of a measurement signal can be easily be identified. Thus, the probability of overlooking such distortions or failures can be reduced. Furthermore, by providing the results of the analysis in form of abstract representations, a user can grasp the results in a very efficient and ergonomic manner. In this way, the analysis of a measurement signal, in particular the analysis of the waveform of a measurement signal can improved.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures of the drawings, in which.

Figure 1:
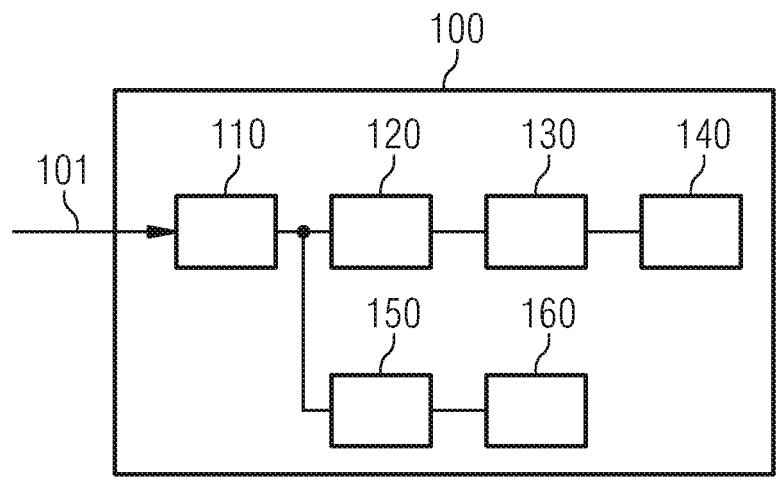
FIG. 1: shows a block diagram of an embodiment of a measurement apparatus according to the present invention.

The append drawings are intended to provide further understanding of the embodiments of the invention. They illustrate embodiments and, in conjunction with the description, help to explain principles and concepts of the invention. Further embodiments and many of the advantages mentioned become apparent in view of the drawings. The elements in the drawings are not necessarily shown in scale.

In the drawings same, functionally equivalent and identical operating elements, features and components are provided with same or similar reference signs in each case, unless stated otherwise.

DETAILED DESCRIPTION OF THE DRAWINGS

FIG. 1 shows a block diagram of an embodiment of a measurement apparatus 100. The measurement apparatus 100 comprises an acquisition device 110, a segmenting device 120, a processing device 130 and an output device 140. Further, the measurement apparatus 100 may comprise an analyzing device 150. Optionally, the measurement device 100 may further comprise a memory 160. The measurement device 100 may receive a measurement signal 101. The measurement signal 101 may be an analogue or digital signal. If the measurement signal 101 is an analogue signal, the analogue measurement signal may be converted into a digital data stream, for instance, by an analogue to digital converter. The analogue to digital converter may be included in the measurement apparatus 100, in particular in the acquisition device 110. Alternatively, the analogue to digital conversion may be performed outside the measurement apparatus 100 by an external analogue to digital converter. Alternatively, the data acquisition may be performed in a digital domain and a digital measurement signal 101 may be provided to the measurement apparatus 100.

The measurement signal 101 may be received by the acquisition device 110 of the measurement apparatus 100. The acquisition device 110 may receive the signal 101 and acquire a waveform of the received measurement signal 101. For example, the acquisition device may apply a normalization of the measurement signal 101. Furthermore, any other appropriate operation, for example an amplification, attenuation, filtering, demodulation or the like may be also possible.

The acquired waveform of the measurement signal 101 is provided to segmenting device 120. Segmenting device 120 may divide the acquired waveform of the measurement signal 101 into multiple sections. In particular, segmenting device 120 may segment the acquired waveform in multiple successive sections. For example, the individual sections of the acquired waveform may be sections having a predetermined length. The predetermined length may relate to a specific period of time or a specific number of samples. Any other measure for dividing the acquired waveform into individual sections may be also possible. Alternatively, it may be also possible to adapt the length for dividing the waveform into individual sections of the acquired waveform. For example, segmenting device 120 may use a specific property of the acquired waveform for identifying the individual sections. In a possible example, segmenting device 120 may identify a rising or falling edge. Thus, a length of the individual sections may be set depending on a distance between two edges. However, it is understood that any other appropriate property or measure in the acquired waveform of the measurement signal 101 may be also used for setting the length of the individual sections. For example, segmenting device 120 may identify a frequency in the acquired waveform and set the length of the individual sections based on the period length of the respective frequency. Furthermore, a specific threshold may be used, and the length of the sections may be set based on intervals of rising or falling below such a threshold value. Furthermore, any other appropriate scheme for setting a length of the sections of the acquired waveform may be also possible.

Processing device 130 analyzes the waveform of the individual sections of the acquired waveform. For example, processing device 130 may compare the waveform of a section with a specific desired waveform. Accordingly, processing device 130 may determine whether or not the waveform in a segment matches the desired waveform or whether the waveform in a segment does not match the requirements. In case the waveform in a segment does not correspond to the desired requirements, processing device 130 may determine a type of deviation. The type of deviation may be classified. Accordingly, processing device 130 may assign a signal integrity identifier for each section of the acquired waveform. The signal integrity identifier may specify whether the waveform in the respective section matches the predetermined requirements, or the signal integrity identifier may specify a kind of deviation of failure in the waveform of the respective section. In this way, the processing device 130 may assign a corresponding signal integrity identifier to each section of the acquired waveform. Thus, each section of the acquired waveform can be characterized by the respective signal integrity identifier. Accordingly, a later analysis of the waveform of the measurement signal 101, in particular an evaluation of the individual sections of the acquired waveform can be easily performed by considering the signal integrity identifiers associated to the respective sections of the waveform.

For this purpose, the output device 140 may output a representation of the signal integrity identifier associated to a section of the acquired waveform. In particular, for each section of the acquired waveform, the output device 140 may provide a corresponding representation of the signal integrity identifier. In particular, the representation of a signal integrity identifier may be an abstract representation, for example an abstract representation, which may illustrate the respective signal integrity identifier or characteristics, which are associated with the respective signal integrity identifier. For example, the representation of the respective signal integrity identifier may be provided in an optical or acoustical form. However, any other kind of providing the representation of the signal integrity identifiers may be also possible.

In order to determine an appropriate signal integrity identifier for a section of the acquired waveform, the processing device 130 may evaluate one or more characteristic properties of the acquired waveform in the respective section. Such characteristic properties may be, for example, a runt, a glitch, a duty cycle distortion, a slew rate, crosstalk, intersymbol interference, reflections, ripples or noise. Accordingly, processing device 130 may analyze the waveform in a section of the acquired waveform in order to determine whether the waveform in the respective section is error-free, i.e. no distortions or failures with respect to a desired waveform are detected in the respective section, or whether a specific distortion or failure is detected in the respective section of the waveform. The evaluation of the waveform in the respective section may be performed by any appropriate manner. For example, a histogram of the waveform may be computed, and the histogram data may be evaluated in order to determine a signal integrity identifier of the respective section. This will be described in more detail below. However, it is understood that any other appropriate scheme for determining an appropriate signal integrity identifier for a section of the acquired waveform may be also possible.

The signal integrity identifiers of the individual sections of the waveform may be provided in any appropriate manner. For example, a signal integrity identifier related to a section of the waveform may be recorded together with the measurement device of the respective section. Additionally, or alternatively, it may be also possible to provide the respective signal integrity identifier to a further device, for instance by means of a data link. For this purpose, the data for specifying the signal integrity identifiers may be provided to a further device via an interface or the like (not shown). Furthermore, the signal integrity identifier may be output by the output device 140. In particular, optical or acoustical representations of the signal integrity identifiers may be provided to a user by the output device 140.

Output device 140 may provide a representation of the signal integrity identifiers associated to the respective sections of the acquired waveform, for instance by a graphical representation, an alphanumeric element, a color or an audio output. For example, a frequency of an acoustic output signal may change depending on the corresponding signal integrity identifier. Alternatively, no acoustical output signal may be provided if the related section of the acquired waveform is error-free, and an acoustical signal may be provided upon detecting a distortion of failure in the related section of the acquired waveform. However, any other scheme for providing acoustical output may be possible, too. Furthermore, the representation of the signal integrity identifier may be also provided by optical elements, for example by a visualization of the signal integrity identifiers assigned to the sections of the acquired waveform.

Figure 2:
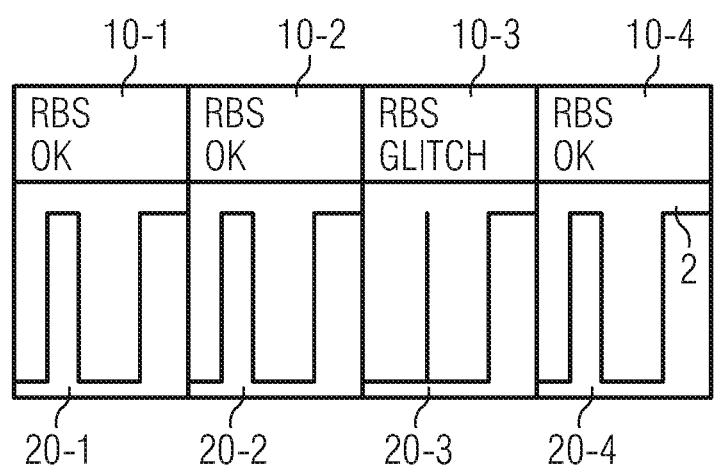
FIG. 2: shows an exemplary illustration for providing a result of an analysis according to an embodiment.

FIG. 2 shows an exemplary representation of signal integrity identifiers associated to segments of an acquired waveform according to an embodiment. In this example, the representations 10-$i$ of the signal integrity identifiers are shown in association with the related sections 20-$i$ of the acquired waveform 2. As can be seen in this example, the waveform 2 is divided into at least four sections 20-$i$. However, it is understood that the example of only four segments is only for illustrative purpose and does not limit the scope of the present invention. Furthermore, any number of sections 20-$i$ for analyzing in an acquired waveform may be possible.

In the example according to FIG. 2, the waveform 2 of the measurement signal may be a pulse signal, in particular a pulse signal having a specific duty cycle. Accordingly, the pulses in the first, second and fourth segment fit the desired requirements of the signal. Furthermore, a glitch is detected in the third segment. Accordingly, the signal integrity identifier of the first, second and fourth segment may specify that the respective waveforms are error-free. This may be indicated by providing the alphanumeric element "OK" as representations 10-1, 10-2 and 10-4 of the related signal integrity identifiers. Furthermore, the representation 10-3 of the third segment may specify "GLITCH" to indicate the detected glitch in the third segment. Accordingly, the representation for the signal integrity identifiers of the individual sections are provided in text form in this example. By providing the representations 10-$i$ of the signal integrity identifiers together with the graphical representation of the signal curve 2 of the measurement signal, a user can easily identify abnormalities such as distortions or failures in the waveform of the measurement signal. Furthermore, by providing an abstract representation, for example an alphanumeric element such as a text, the user can recognize the respective distortion or failure. Furthermore, it may be also possible to change a color of the signal curve 2 and/or the representation 10-$i$ of the signal integrity identifiers depending on the respective signal integrity identifier. For example, an error-free section may be displayed in a first color, for example green, and failures or distortions may be provided in one or more further colors. In particular, either the representation itself or the background of the representation may change the color depending on the related signal integrity identifier.

Figure 3:
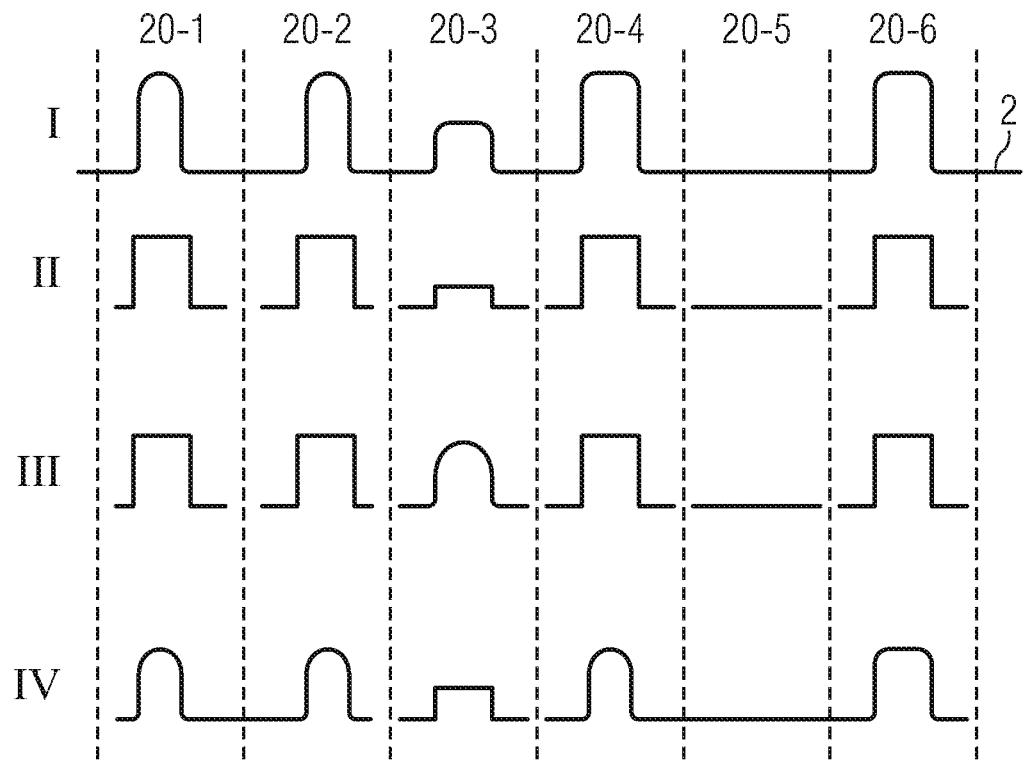
FIG. 3: shows a number of alternative possibilities for providing the results of the analysis of a waveform of a signal according to embodiments.

FIG. 3 shows some further examples for providing representations of signal integrity identifiers associated to sections of an acquired waveform. In first row I, the waveform of a measurement signal 2 is shown. In this example, six sections 20-$i$ of the waveform 2 are illustrated. In the first section 20-1, the pulse is at a beginning of the section, in the second section 20-2, the pulse is at the ending of the section. In the third section 20-3, a runt may occur, i.e. the pulse may have only a limited amplitude. The fourth and the six section 20-4 and 20-6 may have a pulse in the center of the section, and the fifth section 20-5 does not comprise a pulse at all.

As can be seen in the second row II of FIG. 3, a graphical representation of a signal integrity identifier may be provided. Accordingly, the position of the pulses may be shown accordingly in the first and the second section, and the runt of the signal may be illustrated by a pulse having only limited amplitude.

As can be further seen in the third row III of FIG. 3, it may be also possible to use abstract representations of the waveform for those sections, which relate to an expected (error-free) waveform. Furthermore, a section relating to a waveform with a distortion or error may be provided by indicating the real signal waveform. Accordingly, the third section with a runt may be shown by providing the waveform of the runt, whereby the remaining sections are provided by abstract representations of the related waveforms.

In the fourth row IV of FIG. 3, only sections with a particular property, for example a distortion or an error, may be indicated by an abstract representation of the related signal integrity identifier, wherein the waveform of the remaining sections are illustrated by providing the real signal curve. Furthermore, it may be also possible to apply different colors depending on the associated signal integrity identifier or to perform any other modification.

In order to further assist a user, it may be possible to perform a further analysis of the individual sections of the acquired waveform. For this purpose, a user may select a number of one or more sections, and the selected sections may be further analyzed. For example, the selected sections may be zoomed in time and/or amplitude. For this purpose, an automated selection may be performed for selecting a section of the waveform having a specific signal integrity identifier. For example, sections with a distortion or failure may be automatically selected. In particular, it may possible to specify one or more particular signal integrity identifiers, and an automated selection of sections with the specified signal integrity identifiers are selected automatically. Furthermore, it may possible to automatically perform a particular operation, for example a zooming operation or the like based on a signal integrity identifier assigned to a section of the acquired waveform. However, it is understood that any other kind of operation may be also applied automatically or semi-automatically based on an assigned signal integrity identifier.

Figure 4:
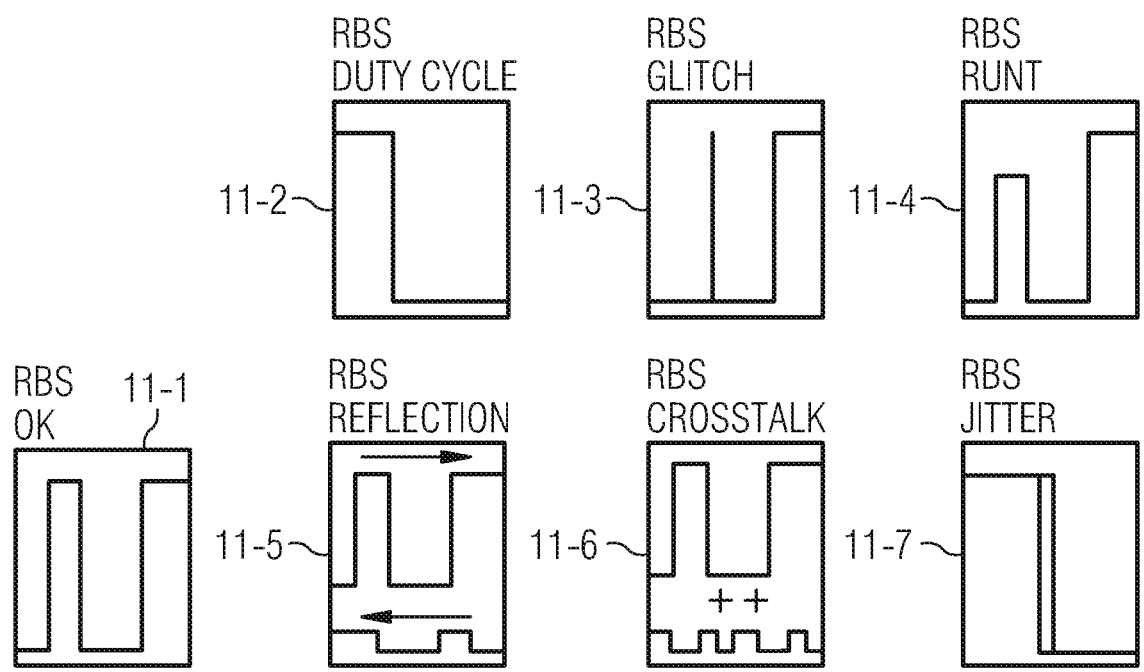
FIG. 4: shows a number of graphic representations for indicating signal integrity identifiers.

FIG. 4 shows some examples of abstract graphical representations for signal integrity identifiers. Representation 11-1 may illustrate an error-free pulse signal. Representation 11-2 may illustrate, for example, an abnormality in a duty cycle of a pulse signal. Representation 11-3 may illustrate a glitch, representation 11-4 may illustrate a runt. Furthermore, representation 11-5 may illustrate a reflection of a signal, and representation 11-6 may illustrate a detected crosstalk. Further, representation 11-7 may illustrate a jitter. However, it is understood that any further property of a waveform may be also illustrated by appropriate graphical elements. Furthermore, as already discussed above, the respective signal integrity identifier may be also provided by alphanumeric elements, in particular by a text or an abbreviation.

Figure 5:
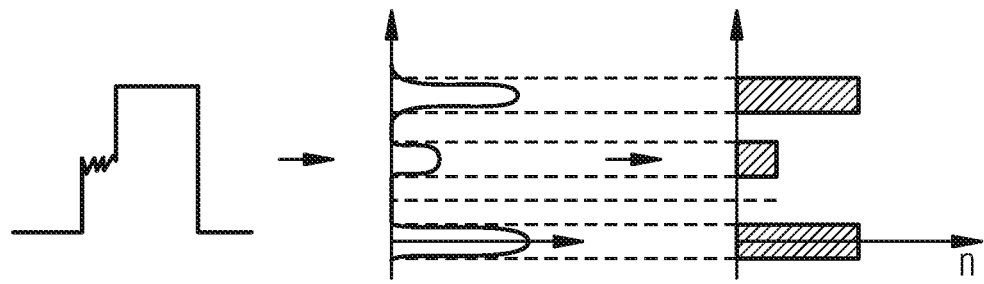
FIG. 5: shows a schematic illustration for computing histogram data according to an embodiment.

FIG. 5 shows a schematic diagram illustrating an approach for computing histogram data, in particular amplitude histogram data. The computation of the histogram data may be performed, for instance, by an analyzing device 150 of the measurement apparatus 100. As can be seen in the left diagram of FIG. 5, the pulse signal 2 may comprise a distortion 21. The resulting histogram of the waveform in this section is shown in the center diagram of FIG. 5. In order to further simplify the histogram, the almost continuous distribution may be divided in a limited number of slices as shown in the right diagram of FIG. 3. For this purpose, the number of one or more threshold values may be applied and for each slice between neighboring thresholds values a corresponding histogram value is computed by counting the number of amplitude values in the respective slice. As can be easily seen from this example, an error-free rectangular signal would have only values in the top and bottom slice, wherein the remaining slices would have almost no amplitude values. Due to the error 21, at least some of the further slices may also comprise a significant number of signal values. Accordingly, by analyzing the histogram data, a corresponding distortion or error can be detected. Thus, the signal integrity identifier may be determined based on the histogram data of a segment of the acquired waveform.

Figure 6:
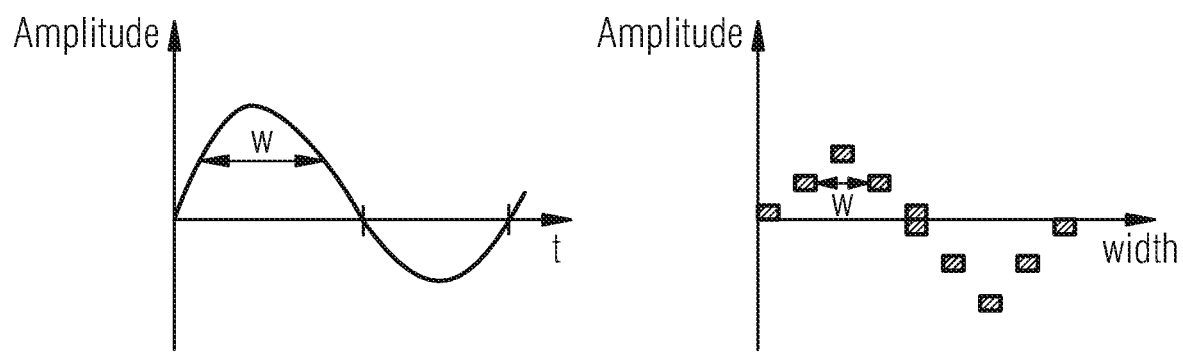
FIG. 6: shows a schematic illustration for computing histogram data according to a further embodiment.

FIG. 6 shows an example for determining a so-called width histogram of a signal according to an embodiment. In the left column of FIG. 6, a waveform 2 of a signal is illustrated. In the right diagram of FIG. 6, the corresponding width w histogram is illustrated. In this width-histogram, the width counts the number of samples between two signal values having same or similar amplitude. As already mentioned above, a number of one or more threshold values may be applied for slicing the histogram. The slicing may be applied with respect to the width as well as with respect to the amplitude.

By computing histogram data of the values of a waveform a segment of the acquired waveform, the amount of data can be reduced. Furthermore, the computation of the histogram data may be used as a kind of preprocessing for a further analysis of the measurement device of the waveform of a measurement signal. For example, the computed histogram data may be used for determining an appropriate signal integrity identifier of a section of the acquired waveform. For this purpose, it may be possible to compare the computed histogram data with predetermined patterns of histogram data. In an example, it may be possible to compute a number of histogram patterns or fingerprints for a number of specific characteristic properties of a waveform signal. The patterns or fingerprints may be stored, for example in a memory of the measurement device 100. Accordingly, the processing device 130 may compare a computed histogram of a section of the acquired waveform with the precomputed patterns or fingerprints in order to identify in corresponding signal integrity identifiers.

In an alternative example, it may be also possible to use a neural network for determining an appropriate signal integrity identifier. For this purpose, the measurement device of a segment of an acquired waveform may be provided to a neural network and the neural network outputs an appropriate signal integrity identifier or a probability distribution for a number of signal integrity identifiers.

Furthermore, it may be also possible to provide the neural network with computed histogram data of a section of the acquired waveform. Accordingly, the neural network only has to evaluate the histogram data for determining an appropriate signal integrity identifier or a probability distribution for multiple signal integrity identifiers. In this way, the computational effort can be reduced. Consequently, the required computational hardware can be simplified and/or the time for computing can be minimized.

In an embodiment, it may be further possible to store the computed histogram data in a memory 160. Accordingly, the recorded histogram data are further available for any kind of later operations. For example, the stored histogram data may be used for later displaying a signal curve, a zooming operation or any other processing of the stored histogram data. In this way, a later analysis and evaluation of the waveform can be performed.

Figure 7:
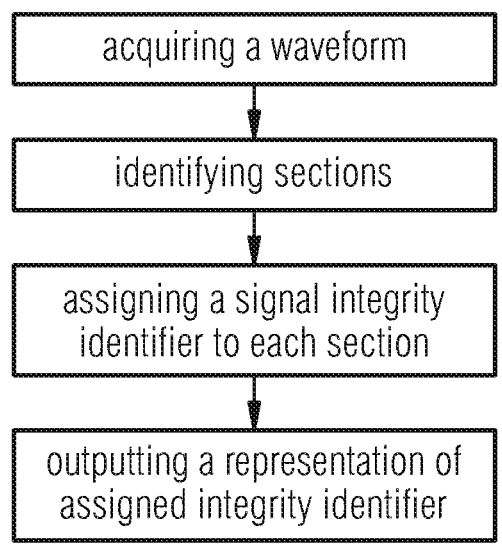
FIG. 7: shows a flow diagram of a method for analyzing a waveform according to an embodiment.

FIG. 7 shows a flow diagram of a method for analyzing a waveform of a signal. The method comprises a step S1 of acquiring a waveform of a signal, and a step S2 of identifying a number of sections in the acquired waveform. The method further comprises a step S3 of assigning a signal integrity identifier to each section of the number of sections in the acquired waveform, and a step S4 of outputting the representation of the respective assigned signal integrity identifier for each section of the number of sections.

The signal integrity identifiers may be assigned based on at least one characteristic property of the waveform in the respective section.

The representation of the signal integrity identifier may comprise at least one of a graphical representation, an alphanumeric element, a color or an audio output.

In particular, a representation of the waveform of the signal may be displayed when outputting the representation of the respective signal integrity identifier. In particular, the representation of the waveform and the representation of the signal integrity identifier may be provided in association with each other.

The method may further comprise automatically zooming a displayed representation of the waveform of the signal relating to a predetermined signal integrity identifier.

The method may further comprise automatically selecting a section of the output representation related to a predetermined signal integrity identifier.

The method may further comprise computing a histogram of the acquired waveform of the signal. In particular, the histogram data may relate to an amplitude histogram and/or a width histogram.

When computing the histogram data, the waveform of the signal may be divided into a number of slices based on at least one threshold value, and the histogram data may be determined based on the sliced waveform.

In particular, the computed histogram data may comprise a pulse width histogram.

Accordingly, the identification of the individual sections in the acquired waveform may be performed based on the determined histogram data.

Additionally, or alternatively, the assigning of a signal integrity identifier or a section of the acquired waveform may be performed based on the determined histogram data.

In particular, a neural network may be used for identifying the sections of the waveform and/or for assigning the signal integrity identifier of a section of the waveform.

Summarizing, the present invention relates to an analysis of a waveform of a signal. It is for this purpose that the waveform of the signal is divided into multiple sections and a signal integrity identifier is assigned to each section. Accordingly, a representation of the respective signal integrity identifier may be provided for each section of the waveform. The representation of the signal integrity identifier may comprise an abstract representation, for example a graphical element, an alphanumeric element, a color or even an audio signal.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon re-viewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not in-tended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A measurement apparatus for analyzing a waveform of a signal, the apparatus comprising:
    an acquisition device for acquiring a waveform of a signal;
    a segmenting device for identifying a number of sections in the acquired waveform;
    a processing device for assigning a signal integrity identifier to each section of the number of sections in the acquired waveform; and
    an output device for outputting, for each sections of the number of sections, a representation of the respective assigned signal integrity identifier.

2. The apparatus of claim 1, wherein processing device assigns the signal integrity identifiers based on at least one characteristic property of the acquired waveform in the respective section.

3. The apparatus of claim 2, wherein the at least one characteristic property comprises at least one of error-free, a runt, a glitch, duty cycle distortion, slew rate, crosstalk, intersymbol interference, reflection, ripple, jitter or noise.

4. The apparatus of claim 1, wherein the representation of the signal integrity identifier comprises at least one of a graphical representation, an alphanumeric element, a color or an audio output.

5. The apparatus of claim 1, wherein the output device is configured to display a representation of the waveform of the signal, and to output the representation of the signal integrity identifier in association with the displayed representation of the waveform of the signal.

6. The apparatus of claim 5, wherein the output device is configured to automatically zoom the displayed representation of the waveform of the signal relating to a predetermined signal integrity identifier.

7. The apparatus of claim 1, comprising a selection device for automatically selecting a section of the output representation of the respective assigned signal integrity identifier which relates to a predetermined signal integrity identifier.

8. The apparatus of claim 1, comprising an analyzing device for computing histogram data of a section of the acquired waveform of the signal.

9. The apparatus of claim 8, wherein the processing device is configured compare the computed histogram data with a number of prestored reference data and to assign the respective signal integrity identifier based on result of the comparison.

10. The apparatus of claim 8, wherein analyzing device is configured to divide the waveform of the signal into a number of slices based on at least one threshold value, and to determine the histogram data based on the sliced waveform.

11. The apparatus of claim 8, wherein the computed histogram data comprises a pulse width histogram.

12. The apparatus of claim 8, wherein the segmenting device is configured to identify the sections in the acquired waveform based on the determined histogram data.

13. The apparatus of claim 8, wherein the processing device is configured to assign the signal integrity identifiers based on the determined histogram data.

14. The apparatus of claim 8, wherein the analyzing device comprising a neural network for identifying sections of the waveform or for assigning a signal integrity identifier to a section of the waveform.

15. The apparatus of claim 8, comprising a memory for storing the computed histogram data.

16. A method for analyzing a waveform of a signal, the method comprising:
- acquiring a waveform of a signal;
- identifying a number of sections in the acquired waveform;
- assigning a signal integrity identifier to each section of the number of sections in the acquired waveform; and
- outputting a representation of the respective assigned integrity identifier for each sections of the number of sections.

* * * * *